United States Patent
Yan

(10) Patent No.: US 9,947,690 B2
(45) Date of Patent: Apr. 17, 2018

(54) DISPLAY PANEL

(71) Applicant: InnoLux Corporation, Miao-Li County (TW)

(72) Inventor: Tzu-Min Yan, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/363,487

(22) Filed: Nov. 29, 2016

(65) Prior Publication Data

US 2017/0170210 A1 Jun. 15, 2017

(30) Foreign Application Priority Data

Dec. 15, 2015 (CN) .......................... 2015 1 0929373

(51) Int. Cl.
| | |
|---|---|
| *H01L 27/12* | (2006.01) |
| *H01L 27/32* | (2006.01) |
| *H01L 29/786* | (2006.01) |
| *G02F 1/1339* | (2006.01) |
| *G02F 1/1345* | (2006.01) |
| *G02F 1/1333* | (2006.01) |
| *G02F 1/1335* | (2006.01) |
| *G02F 1/1343* | (2006.01) |

(Continued)

(52) U.S. Cl.
CPC ........ *H01L 27/1225* (2013.01); *G02F 1/1339* (2013.01); *G02F 1/1345* (2013.01); *H01L 27/124* (2013.01); *H01L 27/1248* (2013.01); *H01L 27/3211* (2013.01); *H01L 27/3258* (2013.01); *H01L 27/3276* (2013.01); *H01L 29/7869* (2013.01); *G02F 1/137* (2013.01); *G02F 1/1368* (2013.01); *G02F 1/13439* (2013.01); *G02F 1/133345* (2013.01); *G02F 1/133514* (2013.01); *G02F 1/134309* (2013.01); *G02F 1/136286* (2013.01); *G02F 2001/133388* (2013.01); *G02F 2001/134345* (2013.01); *G02F 2001/134372* (2013.01); *G02F 2201/121* (2013.01); *G02F 2201/123* (2013.01); *G02F 2201/50* (2013.01)

(58) Field of Classification Search
CPC ... H01L 21/782; H01L 21/8232; H01L 21/07; H01L 21/0744
See application file for complete search history.

(56) References Cited

U.S. PATENT DOCUMENTS

| | | |
|---|---|---|
| 7,190,419 B2 | 3/2007 | Park |
| 7,489,380 B2 | 2/2009 | Lim et al. |
| | (Continued) | |

*Primary Examiner* — Cheung Lee
(74) *Attorney, Agent, or Firm* — Muncy, Geissler, Olds & Lowe, P.C.

(57) ABSTRACT

A display panel is disclosed. The display panel includes a first substrate, a display layer, a first conductive layer, a first insulation layer, a first protective layer, and a second insulation layer. The first substrate includes an active area and a peripheral area located adjacent to the active area. The display layer is disposed over the first substrate. The first conductive layer is disposed over the first substrate and located in the peripheral area. The first insulation layer is disposed between the first substrate and the first conductive layer. The first protective layer covers the first conductive layer. The second insulation layer is disposed over the first protective layer. The display panel according to the disclosure has better corrosion resistance to improve its reliability.

19 Claims, 5 Drawing Sheets

(51) Int. Cl.
G02F 1/1362 (2006.01)
G02F 1/1368 (2006.01)
G02F 1/137 (2006.01)

(56) References Cited

U.S. PATENT DOCUMENTS

| | | |
|---|---|---|
| 8,609,477 B2 | 12/2013 | Song et al. |
| 2009/0250244 A1 | 10/2009 | Tsuda et al. |
| 2012/0206325 A1 | 8/2012 | Yamazaki et al. |
| 2013/0002527 A1* | 1/2013 | Kim .................... H01L 29/786 345/82 |
| 2014/0125907 A1 | 5/2014 | Nakazawa et al. |
| 2016/0195741 A1* | 7/2016 | Shiau ................... G02F 1/1337 349/106 |

* cited by examiner

DISPLAY PANEL

CROSS REFERENCE TO RELATED APPLICATIONS

This Non-provisional application claims priority under 35 U.S.C. § 119(a) on Patent Application No(s). 201510929373.1 filed in People's Republic of China on Dec. 15, 2015, the entire contents of which are hereby incorporated by reference.

BACKGROUND OF THE INVENTION

Field of Invention

The disclosure relates to a display panel and, in particular, to a display panel with high reliability.

Related Art

With the advance of technology, flat display devices are widely applied to various fields. Because flat display devices have advantages of compact volume, low power consumption, and non-radiation, they gradually replace traditional cathode ray tube (CRT) display devices and are applied to various electronic products, for example, mobile phones, portable multimedia devices, notebook computers, televisions, monitors, and so on.

For example, a conventional LCD device includes a thin film transistor (TFT) substrate, a color filter substrate, and a liquid crystal layer. The TFT substrate is disposed opposite the color filter substrate, and the liquid crystal layer is sandwiched between the two substrates so as to form a plurality of pixels. When scan signals are inputted from scan lines to the gates of TFTs in the corresponding pixels, the data voltages from data lines are inputted to pixel electrodes through the TFTs by controlling the TFTs so as to control the twist of liquid crystal molecules and display images.

Products with flat display panel, especially small and medium sized display panel (e.g. mobile phones and tablet computers), are often used under harsh conditions so corrosion resistance is very important. However, in the non-active area (i.e. the peripheral area) of the current small and medium sized display panel, due to the poor protection in a trace region or terminal portion (also known as bonding pad) in the peripheral area for example, water and ions easily enter the product and result in corrosion of its conductive layer. As a result, the reliability of the display panel is reduced.

Therefore, it is important to provide a display panel which has better corrosion resistance (anti-corrosion ability) to improve its reliability.

SUMMARY OF THE INVENTION

An aspect of the disclosure is to provide a display panel which has better corrosion resistance to improve its reliability.

A display panel according to the disclosure includes a first substrate, a display layer, a first conductive layer, a first insulation layer, a first protective layer, and a second insulation layer. The first substrate includes an active area and a peripheral area located adjacent to the active area. The display layer is disposed over the first substrate. The first conductive layer is disposed over the first substrate and located in the peripheral area. The first insulation layer is disposed between the first substrate and the first conductive layer. The first protective layer covers the first conductive layer. The second insulation layer is disposed over the first protective layer.

In one embodiment, the material of the first protective layer is selected from at least one of indium tin oxide, indium zinc oxide, aluminum zinc oxide, gallium zinc oxide, indium zinc tin oxide, and zinc oxide.

As mentioned above, as to the display panel according to the disclosure, the first protective layer covers the first conductive layer located in the peripheral area, so that the following processes (e.g. etching process) would damage the first conductive layer less. Moreover, the first protective layer protects the first conductive layer from the corrosion resulting from water and ions entering. Further, if the first conductive layer is disconnected for any reason, electrical signals can be transmitted by the first protective layer. Thus, the risk of failure of the display panel is reduced.

BRIEF DESCRIPTION OF THE DRAWINGS

The disclosure will become more fully understood from the detailed description and accompanying drawings, which are given for illustration only, and thus are not limitative of the disclosure, and wherein.

DETAILED DESCRIPTION OF THE DISCLOSURE

The embodiments of the disclosure will be apparent from the following detailed description, which proceeds with reference to the accompanying drawings, wherein the same references relate to the same elements.

In the disclosure, a first structure (a layer, an element, or a film) is disposed or located over a second structure (a layer, an element, or a film) which means the two structures could be directly contact or in-directly contact. For directly contact, a surface of the first structure contacts with a corresponding surface of the second structure. For in-directly contact, there is at least one inter-structure (inter-layer, inter-element, inter-film or inter-space) disposed or located between the two structures, and the first structure and the second structure are separated to each other. The inter-structure could be single layer or multi-layer. The inter-structure could comprise an entity structure (solid or liquid) or a virtual structure (air).

In the disclosure, a first structure (a wire, a transistor, a capacitance, or other elements of a circuit) is coupled to a second structure (a wire, a trace, a switch, a capacitance, or other elements of a circuit) which means the two structures could be directly electrically connected or in-directly electrically connected. For directly electrical connection, the terminal of the first structure is directly electrically connected to a corresponding terminal of the second structure or by a wire. For in-directly electrical connection, the terminal of the first structure is electrically connected to the terminal of the second structure through at least one element, e.g. switch (TFT), diode, capacitance, resistance, inductance, or other kind of circuit elements.

In the disclosure, a thickness of a structure means an average thickness excepting for the outliers. The outliers could be values on the edge, in the obvious concave or convex. Excepting the outliers, the thickness values of the structure could be within three standard deviations.

Figure 1A:
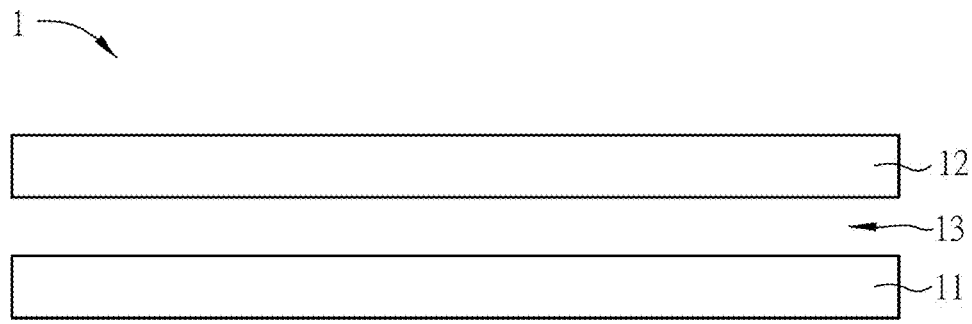
FIG. 1A is a schematic diagram showing a display panel according to an embodiment of the disclosure.
Figure 1B:
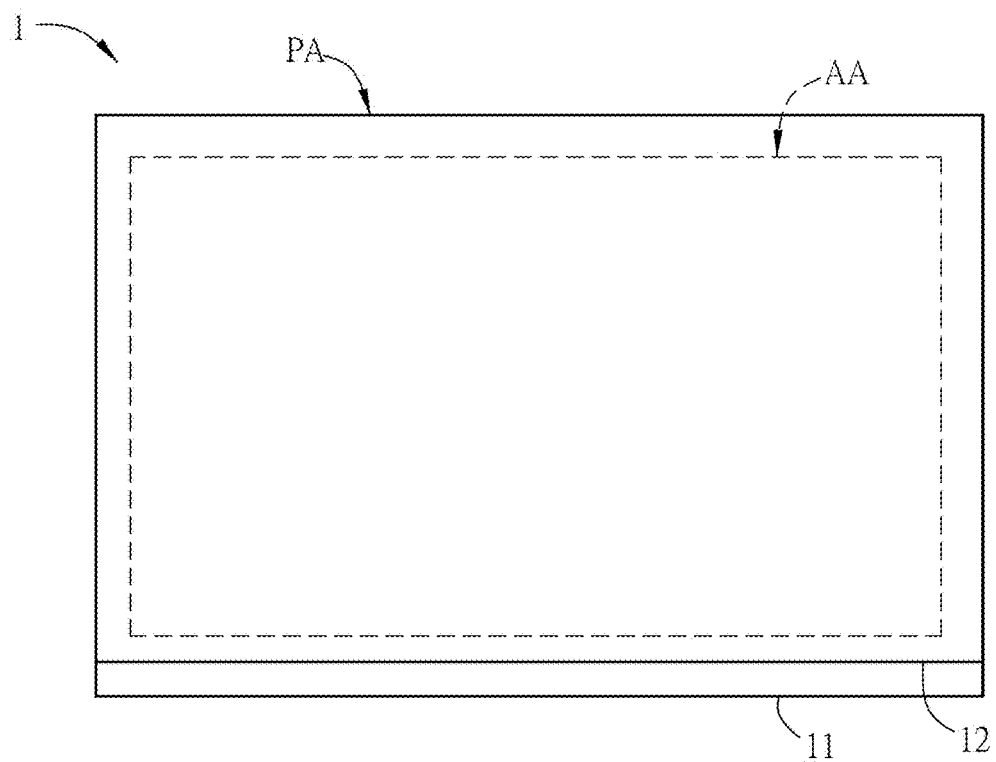
FIG. 1B is a schematic top view showing the display panel in FIG. 1A.
Figure 1C:
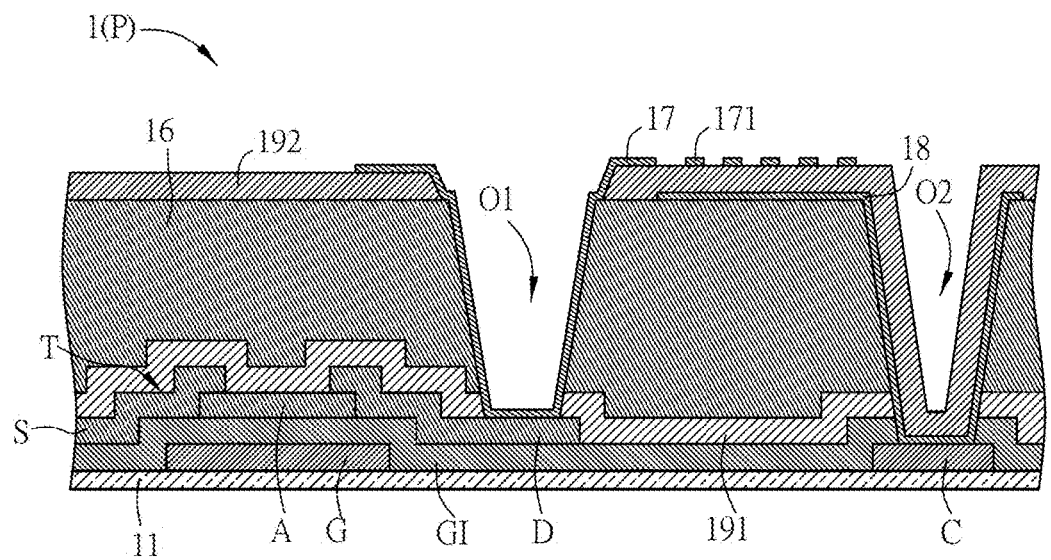
FIG. 1C is a sectional schematic diagram showing a sub-pixel in the active area of the display panel.

Referring to FIG. 1A, FIG. 1B and FIG. 1C, FIG. 1A is a schematic diagram showing a display panel 1 according to an embodiment of the disclosure, FIG. 1B is a schematic top view showing the display panel 1 in FIG. 1A, and FIG. 1C is a sectional schematic diagram showing a sub-pixel P in the active area AA of the display panel 1.

The display panel 1 may be a liquid crystal display (LCD) panel, an organic light emitting diode (OLED) display panel, an in-organic light emitting diode (LED) display panel, or other kinds of display panel. This embodiment is described by taking an LCD panel as an example. The LCD panel may be a fringe field switching (FFS) LCD panel, an in-plane switching (IPS) LCD panel, a twisted nematic (TN) LCD panel, or a vertical alignment (VA) LCD panel so, more precisely, this embodiment is described by taking an FFS-LCD panel as an example.

The display panel 1 includes a first substrate 11, a second substrate 12, and a display layer 13.

The first substrate 11 includes an active area AA and a peripheral area PA located on the periphery of the active area AA. The active area AA is an area in which light can pass through the first substrate 11 for displaying an image, and the peripheral area PA is an area for disposing a peripheral driving (switch) component, trace, and connecting terminal. The driving (switch) component may be, for example, a gate driver circuit (Gate on Panel, GOP) or other components. In the embodiment, the peripheral area PA is adjacent to and surrounds the periphery of the active area AA for example.

The first substrate 11 is disposed opposite the second substrate 12, and the display layer 13 is disposed between the first substrate 11 and the second substrate 12 and enclosed by a sealing layer (not shown in the figures) to avoid leakage and isolate contamination of ambient water and foreign matter. The material of the sealing layer may be sealant, frit, or other organic (polymer) or inorganic materials. The first substrate 11 and the second substrate 12 are made from transparent material, and they may respectively be, for example, a glass substrate, a quartz substrate, or a plastic substrate, but they are not limited thereto. In the embodiment, the first substrate 11 may be a TFT substrate, and the second substrate 12 may be a color filter substrate. Moreover, the display layer 13 according to the embodiment is a liquid crystal layer and includes a plurality of liquid crystal molecules (not shown in the figures), so that the display panel 1 is an LCD panel. In other embodiments, the color filter is disposed over the first substrate. In another embodiment, if the display panel 1 is an OLED display panel, the display layer 13 may be an OLED layer. In another embodiment, if the display panel 1 is an LED display panel, the display layer 13 may be LED devices. In one embodiment, if the OLED layer or LED devices emit white light, the second substrate 12 may be a color filter substrate. In other embodiments, if the OLED layer or LED devices emit, for example, red light, green light and blue light, the second substrate 12 may be a cover plate to protect the OLED layer or LED devices from contamination of ambient water and foreign matter.

The display panel 1 further includes a plurality of sub-pixels P. The sub-pixels P are located in the active area AA and arranged between the first substrate 11 and the second substrate 12. As shown in FIG. 1C, it is a sectional diagram illustrating a sub-pixel P in the active area AA of the display panel 1. The sub-pixel P includes a TFT T, an insulation layer 191, an insulation layer 16, a first electrode 17, a second electrode 18, and an insulation layer 192. In other embodiments, the sub-pixel P includes more than one TFT T.

The TFT T is disposed over the first substrate 11 and located between the first substrate 11 and the insulation layer 16. Herein, the insulation layer 16 covers the TFT T and the first substrate 11. The TFT T includes a gate G, a dielectric layer GI, a channel layer A, a source S, and a drain D. The gate G is disposed over the first substrate 11, and the material of the gate G may be a monolayer or multilayer structure formed by metal (e.g. aluminium, copper, silver, molybdenum, or titanium) or alloy thereof. Some conductive traces for transmitting driving signal, for example scan lines (not shown in the figure), may be formed of the structure which is in the same layer and formed by the same process as the gate G, and be coupled to the gate G. The dielectric layer GI is disposed over and covers the gate G. Herein, the dielectric layer GI is a gate dielectric layer and an insulation layer, and it may be an organic material, for example, an organic silicone compound, an inorganic material such as silicon nitride, silicon oxide, silicon oxynitride, silicon carbide, aluminium oxide or hafnium oxide, or a multilayer structure thereof. The dielectric layer GI needs to fully cover the gate G and optionally partially or entirely covers the first substrate 11.

The channel layer A is disposed over the dielectric layer GI correspondingly opposite the gate G. In practice, the material of the channel layer A may include, for example, a metal oxide semiconductor (e.g. IGZO), amorphous silicon (a-Si), or low temperature poly silicon (LTPS).

The source S and the drain D are respectively disposed over the channel layer A and located on the two opposite lateral sides of the channel layer A, and one end of the source S and one end of the drain D respectively contact the channel layer A. The source S and the drain D are electrically isolated while the channel layer A of the TFT T is not conducting. Some conductive traces for transmitting driving signal, for example data lines (not shown in the figure), may be formed of the structure which is in the same layer and formed by the same process as the source S and the drain D. The material of the source S and the drain D may be a monolayer or multilayer structure formed by metal (e.g. aluminium, copper, silver, molybdenum, or titanium) or alloy thereof.

It should be noted that the source S and the drain D of the TFT T according to the embodiment are directly disposed over the channel layer A, but the source S and the drain D may also be disposed over an etching stop layer (not shown in the figure) in other embodiments. Moreover, one end of the source S and one end of the drain D may respectively contact the channel layer A through an opening (via) of the etching stop layer. The disclosure is not limited thereto. The etching stop layer may also be an insulation layer. Further, the TFT T according to the embodiment has a bottom gate, back channel etch (BCE) structure. The gate G is located below the channel layer A, and they are separated by a dielectric layer GI. The two sides of the channel layer A are respectively covered with the source S and drain D and coupled to them. In other embodiments, the structure of the TFT T may be top gate type or coplanar type, and it is not limited thereto.

The insulation layer 191 is disposed over one side of the first substrate 11 facing the second substrate 12. Herein, the insulation layer 191 is disposed over the source S and the drain D, and covers the source S and partial drain D. The insulation layer 191 includes a thorough via located on the drain D. The material of the insulation layer 191 may include silicon oxide (SiOx) or silicon nitride (SiNx), and it is not limited thereto.

The insulation layer 16 is disposed over one side of the first substrate 11 facing the second substrate 12, and covers the insulation layer 191 and the TFT T. The insulation layer 16 may be an organic material or an inorganic material. The inorganic material may be, for example, silicon nitride, silicon oxide, silicon oxynitride, silicon carbide, aluminium oxide or hafnium oxide, or a multilayer structure thereof. The organic material may be, for example but not limited to, polyfluoroalkoxy (PFA), polymethylmethacrylate or siloxane. In other embodiments, the insulation layer 16 can be omitted, and then the subsequent components or film layers (e.g. the second electrode 18) directly cover the insulation layer 191 and the TFT T.

The second electrode 18 is disposed over the insulation layer 16, the insulation layer 192 covers the second electrode 18, and the first electrode 17 is disposed over the insulation layer 192. The first electrode 17 is electrically isolated from the second electrode 18 by the insulation layer 192. In the embodiment, a thorough via O1 corresponding to the drain D passes through the insulation layer 191, the insulation layer 16 and the insulation layer 192, and the first electrode 17 is further formed in the thorough via O1 and coupled to the drain D by directly contacting the drain D through the thorough via O1. The materials of the first electrode 17 and the second electrode 18 may be, for example, indium tin oxide (ITO), indium zinc oxide (IZO), aluminum zinc oxide (AZO), cadmium tin oxide (CTO), tin oxide (SnO$_2$), gallium zinc oxide (GZO), indium zinc tin oxide (IZTO), zinc oxide (ZnO), or other transparent conductive materials, but they are not limited thereto.

In the embodiment, the first electrode 17 is the pixel electrode of the sub-pixel P and includes a plurality of electrode portions 171, and the second electrode 18 is a common electrode, so that the display panel 1 is top pixel design. However, in other embodiments, the first electrode 17 may be the common electrode of the sub-pixel P, and the second electrode 18 is the pixel electrode, so that the display panel is top common design, but the disclosure in not limited thereto. Furthermore, in the embodiment, a common electrode line C is disposed over the first substrate 11, and the second electrode (the common electrode) 18 directly contacts the common electrode line C and is coupled to the common electrode line C through another thorough via O2 which passes through the dielectric layer GI, the insulation layer 191, and the insulation layer 16.

Therefore, when a plurality of scan lines corresponding to a plurality of sub-pixels P of the display panel 1 sequentially receive a scan signal, the TFTs T of the sub-pixels P corresponding to the scan lines are accordingly turned on and data signals corresponding to the sub-pixels of respective columns are transmitted to the first electrodes (the pixel electrodes) 17 of the corresponding sub-pixels P by the data lines. Thus, an electric field is formed between the first electrode 17 and the second electrode 18 (the common electrode) to control the rotation of the liquid crystal molecules in the liquid crystal layer 13, so that the display panel 1 can display an image.

Figure 2:
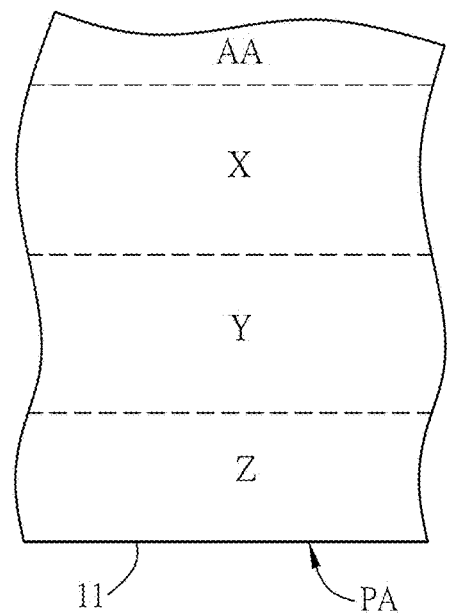
FIG. 2 is an enlarged schematic diagram showing the display panel in FIG. 1B.

Referring to FIG. 2, it is an enlarged schematic diagram showing the display panel 1 in FIG. 1B. FIG. 2 is the enlarged schematic diagram showing the peripheral area PA from the region adjacent to the active area AA to the region distant from the active area AA. Herein, the peripheral area PA can generally be divided into a component/cross-layer region X, a trace region Y, and a terminal region Z. As the name implies, the component/cross-layer region X is a region for disposing a driving component or an antistatic component, or for cross-layer connection, the trace region Y is a region for disposing a conductive trace or for conductive trace passing (the trace region Y may also include a cross-layer structure, and the terminal region Z is a region for disposing a terminal portion coupled to an external circuit (e.g. IC). As a result, external electrical signals can be transmitted to the active area AA through the terminal region Z, the trace region Y, and the component/cross-layer region X. The trace region Y and the component/cross-layer region X are between the active area AA and the terminal region Z. In the embodiment, the trace region Y is between the component/cross-layer region X and the terminal region Z. In other embodiments, the component/cross-layer region X may be between the trace region Y and the terminal region Z.

Figure 3A:
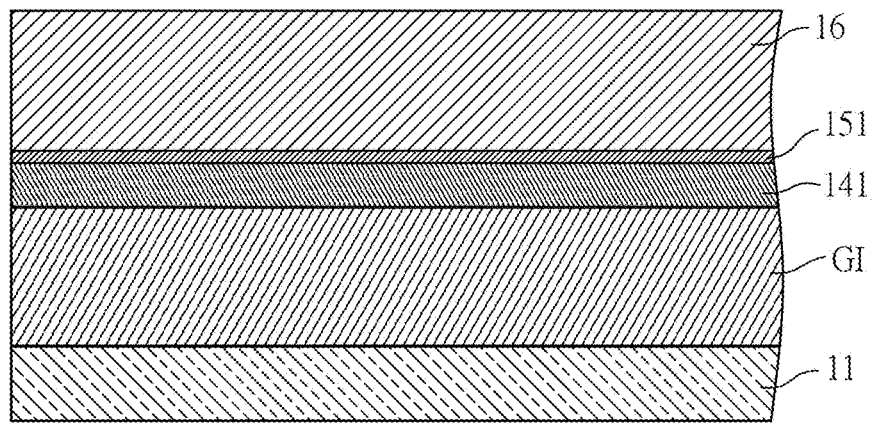
FIG. 3A is a sectional schematic diagram showing an embodiment of the trace region in FIG. 2.
Figure 3B:
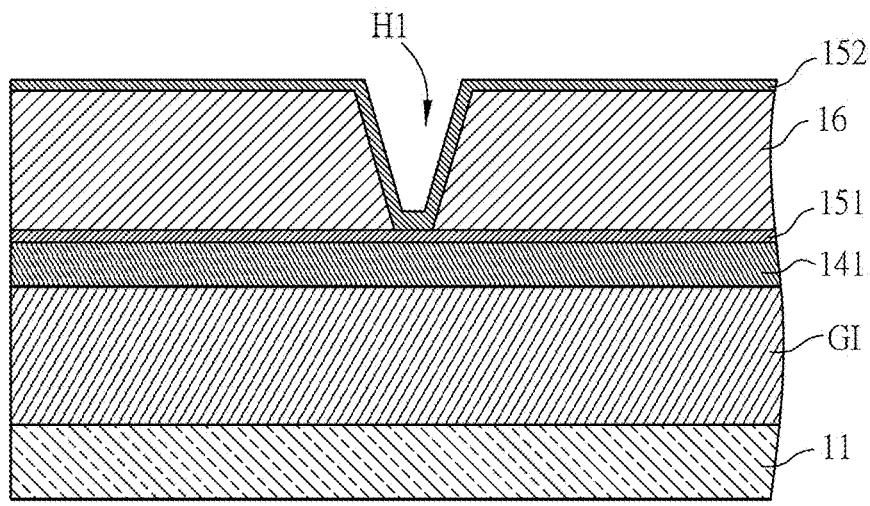
FIG. 3B is a sectional schematic diagram showing an embodiment of the component/cross-layer region in FIG. 2.
Figure 3C:
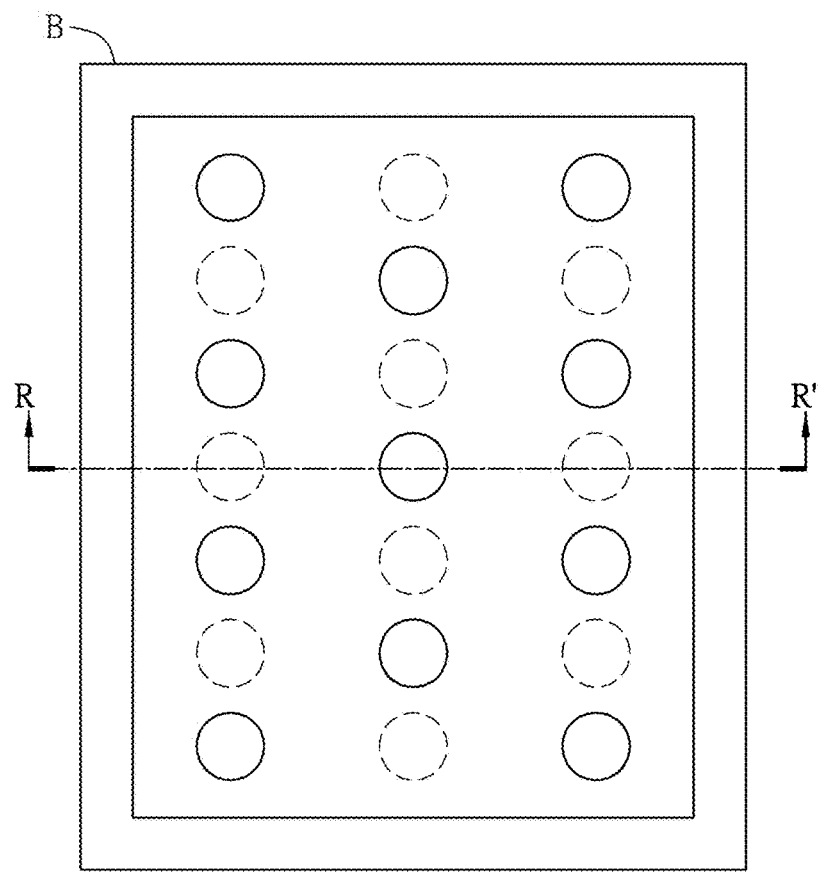
FIG. 3C is a schematic top view showing an embodiment of the terminal region in FIG. 2.
Figure 3D:
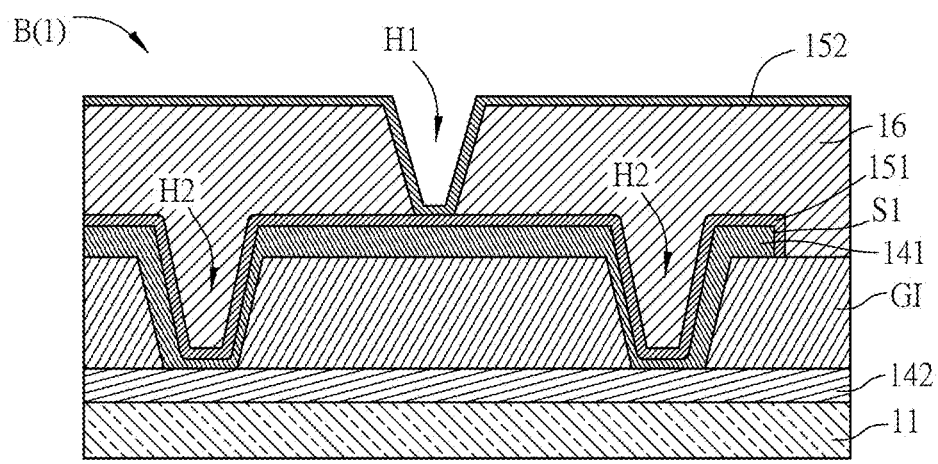
FIG. 3D is a sectional schematic diagram along the line R-R' of the terminal potion shown in FIG. 3C.
Figure 3E:
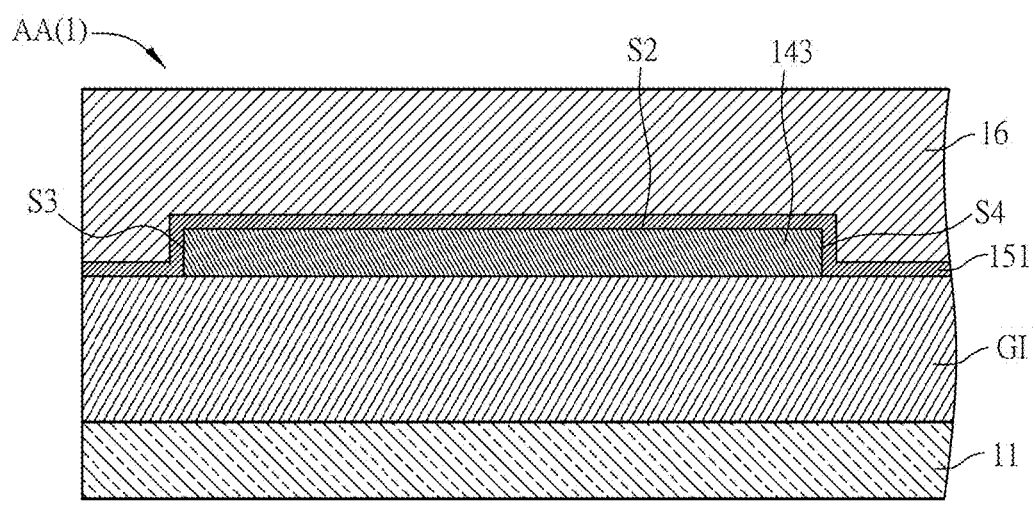
FIG. 3E is a sectional schematic diagram showing an embodiment of the active area in FIG. 2.

Referring to FIG. 3A to FIG. 3E, FIG. 3A is a sectional schematic diagram showing an embodiment of the trace region Y in FIG. 2, FIG. 3B is a sectional schematic diagram showing an embodiment of the component/cross-layer region X in FIG. 2, FIG. 3C is a schematic top view showing an embodiment of the terminal region Z in FIG. 2, FIG. 3D is a sectional schematic diagram along the line R-R' of the terminal potion B shown in FIG. 3C, and FIG. 3E is a sectional schematic diagram showing an embodiment of the active area AA in FIG. 2. Herein, FIG. 3A to FIG. 3E only show some components disposed over the first substrate 11 in the respective regions.

As shown in FIG. 3A, the trace region Y of the display panel 1 which is located in the peripheral area PA may include the first substrate 11, a first conductive layer 141, the dielectric layer GI, a first protective layer 151, and the insulation layer 16. The dielectric layer GI and the insulation layer 16 are extended from the active area AA to the peripheral area PA.

The first conductive layer 141 is disposed over the first substrate 11 and located in the peripheral area PA. Herein, the first conductive layer 141 is a trace and disposed over the first substrate 11 through the dielectric layer GI (the dielectric layer GI is positioned between the first conductive layer 141 and the first substrate 11). The first protective layer 151 covers the first conductive layer 141, and the insulation layer 16 is disposed over the first protective layer 151, and the insulation layer 192 may further be disposed over the insulation layer 16 (not shown in the figure). The materials of the dielectric layer GI and the insulation layer 16 are illustrated above so they are not repeated here. In other embodiments, the first protective layer 151 may only partially cover the first conductive layer 141, the above mentioned insulation layer 191 may be disposed over an area of the first conductive layer 141 which is not covered with the first protective layer 151, and the insulation layer 191 is between the first conductive layer 141 and the insulation layer 16.

The material of the first conductive layer 141 may be a monolayer or multilayer structure formed by metal (e.g.

aluminium, copper, silver, molybdenum, or titanium) or alloy thereof. The first conductive layer 141 according to the embodiment may be formed of the structure which is in the same layer and formed by the same process as the above mentioned source S or drain D of the TFT T of the sub-pixel P disposed in the active area AA. The material of the first protective layer 151 may be transparent conductive oxide (TCO) such as indium tin oxide (ITO), indium zinc oxide (IZO), aluminum zinc oxide (AZO), cadmium tin oxide (CTO), tin oxide ($SnO_2$), gallium zinc oxide (GZO), indium zinc tin oxide (IZTO), zinc oxide (ZnO), or other transparent conductive materials, and it is not limited thereto. The preferred material of the first protective layer 151 is IZO because IZO is an amorphous-type material and less particles are produced during coating. Moreover, the first protective layer 151 can be formed of the same material by the same lithography process with the same photomask as the pixel electrode or the common electrode of the sub-pixel P. Therefore, there is no additional cost for the photomask in the manufacturing process for the first protective layer 151. In one embodiment, the first protective layer 151 is formed of the same material by the same lithography process with the same photomask as the common electrode (the second electrode 18) of the sub-pixel P, and the thickness of the first protective layer 151 is between 300 Å and 1000 Å.

As mentioned above, in this embodiment, the first conductive layer 141 (trace) in the trace region Y of the peripheral area PA is covered with a layer of first protective layer 151 to protect the first conductive layer 141 from being damaged by the following processes (e.g. etching process). Moreover, the first protective layer 151 may also protect the first conductive layer 141 from the corrosion resulting from water and ions entering. Further, if the first conductive layer 141 is disconnected for any reason, electrical signals can be transmitted by the first protective layer 151 which is electrically conductive. Thus, the risk of failure of the display panel 1 is reduced.

Moreover, as shown in FIG. 3B, an example of the cross-layer junction in the component/cross-layer region is illustrated.

Similar to the embodiment shown in FIG. 3A, in addition to the dielectric layer GI, the first conductive layer 141, the first protective layer 151 and the insulation layer 16 which are sequentially disposed over the first substrate 11, the component/cross-layer region X according to this embodiment further includes a second protective layer 152 which is disposed over and covers the insulation layer 16. Accordingly, the first protective layer 151 is between the first conductive layer 141 and the second protective layer 152, and the above mentioned insulation layer 192 may also be disposed over the insulation layer 16 (not shown in the figure). The insulation layer 16 has a first connection via H1, and the second protective layer 152 is further formed in the first connection via H1 and directly contact the first protective layer 151 to be coupled. The second protective layer 152 and the first protective layer 151 may be made from the same material, and they may also be made from the same material by the same lithography process with the same photomask as the pixel electrode or the common electrode of the sub-pixel P in the active area AA. Therefore, there is no additional cost for the photomask during the formation of the second protective layer 152. In one embodiment, the second protective layer 152 is made from the same material by the same lithography process with the same photomask as the pixel electrode (the first electrode 17) of the sub-pixel P, and the thickness of the second protective layer 152 is between 300 Å and 1000 Å. In the embodiment, the cross-layer connection occurs through the first connection via H1. In other embodiments, the width of the first protective layer 151 may be greater than that of the bottom of the first connection via H1 and the first protective layer 151 only partially covers the first conductive layer 141, the above mentioned insulation layer 191 may be disposed over an area of first conductive layer 141 which is not covered with the first protective layer 151, and the insulation layer 191 is between the first conductive layer 141 and the insulation layer 16.

Moreover, in another embodiment, an electronic component (not shown in the figure) may be disposed over the first substrate 11 and located in component/cross-layer region X of the peripheral area PA. The electronic component may be positioned between the first substrate 11 and the insulation layer 16. The electronic component may be a driving component, and it can be coupled to the TFT T in the active area A to drive the display panel 1. For example, the electronic component may be a TFT and the structure thereof is similar to the above mentioned TFT T so it is not repeated here. However, in other embodiments, the electronic component may be other types of components, for example a diode or a capacitor.

Hence, in this embodiment, the first conductive layer 141 in the component/cross-layer region X of the peripheral area PA is covered with the first protective layer 151 to protect the first conductive layer 141 in the component/cross-layer region X from being damaged by the following processes. Moreover, the first protective layer 151 and the second protective layer 152 provide dual protection for the first conductive layer 141 against the corrosion resulting from water and ions entering the component/cross-layer region X.

As shown in FIG. 3C and FIG. 3D, similar to the embodiment shown in FIG. 3B, in addition to the dielectric layer GI, the first conductive layer 141, the first protective layer 151, the insulation layer 16 and the second protective layer 152 which are sequentially disposed over the first substrate 11, the terminal portion B in the terminal region Z of the peripheral area PA further includes a second conductive layer 142 in this embodiment. The second conductive layer 142 is disposed over the first substrate 11, and the dielectric layer GI is disposed between the second conductive layer 142 and the first conductive layer 141. The material the second conductive layer 142 may be a monolayer or multilayer structure formed by metal (e.g. aluminium, copper, silver, molybdenum, or titanium) or alloy thereof. The second conductive layer 142 according to the embodiment may use the structure in the same layer and formed by the same process as the above mentioned gate G of the TFT T of the sub-pixel P disposed in the active area A. Moreover, the insulation layer 16 according to the embodiment also has the first connection via H1, and the second protective layer 152 is further formed in the first connection via H1, and directly contacts and is electrically connected to the first protective layer 151. The dielectric layer GI according to the embodiment has at least a second connection via H2 (the embodiment is described by taking two second connection vias H2 for example), the first conductive layer 141 and the first protective layer 151 are sequentially disposed in the second connection via H2, and the insulation layer 16 also fills the second connection via H2 and covers the first protective layer 151, so that the first conductive layer 141 directly contacts and is coupled to the second conductive layer 142 (cross-layer connection). Further, the first conductive layer 141 has a first top surface and at least one lateral side S1, and the first protective layer 151 further covers the first top surface and the at least one lateral side S1 of the first conductive layer 141. In the embodiment, the first conductive layer 141 may use the structure in the same layer and formed by the same process as the above mentioned source S or drain D of the TFT T of the sub-pixel P disposed in the active area AA. The material of the first protective layer 151 may be transparent conductive oxide (TCO) such as indium tin oxide (ITO), indium zinc oxide (IZO), aluminum zinc oxide (AZO), cadmium tin oxide (CTO), tin oxide ($SnO_2$), gallium zinc oxide (GZO), indium zinc tin oxide (IZTO), zinc oxide (ZnO), or other transparent conductive materials, and it is not limited thereto. The preferred material of the first protective layer 151 is IZO because IZO is an amorphous-type material and less crystallization particles are produced during coating. Moreover, the first protective layer 151 can be formed of the same material by the same lithography process with the same photomask as the pixel electrode or the common electrode of the sub-pixel P. Therefore, there is no additional cost for the photomask in the manufacturing process for the first protective layer 151. In one embodiment, the first protective layer 151 is formed of the same material by the same lithography process with the same photomask as the common electrode (the second electrode 18) of the sub-pixel P, and the thickness of the first protective layer 151 is between 300 Å and 1000 Å. The second protective layer 152 and the first protective layer 151 may be made from the same material, and they may also be made from the same material by the same lithography process with the same photomask as the pixel electrode or the common electrode of the sub-pixel P in the active area AA. Therefore, there is no additional cost for the photomask during the formation of the second protective layer 152, and the thickness of the second protective layer 152 is between 300 Å and 1000 Å. In one embodiment, the second protective layer 152 is made from the same material by the same lithography process with the same photomask as the pixel electrode (the first electrode 17) of the sub-pixel P. In other embodiments, the width of the first protective layer 151 may be greater than that of the bottom of the first connection via H1 and the first protective layer 151 only partially covers the first conductive layer 141, the insulation layer 191 may be disposed over an area of first conductive layer 141 which is not covered with the first protective layer 151, and the insulation layer 191 is between the first conductive layer 141 and the insulation layer 16.

Therefore, in the embodiment, the cross-layer connection occurs through the first connection via H1 and the two second connection vias H2, and the terminal region Z is coupled to an external circuit (e.g. integrated circuit) through the terminal portion B. For example, the terminal portion B is coupled to a driving IC by electroconductive paste, so that the driving IC can transmit electrical signals to the active area AA through the terminal portion B and the cross-layer junctions.

As described above, in the embodiment, the first top surface and the lateral side S1 of the first conductive layer 141 in the peripheral area is covered with the first protective layer 151 to protect the first conductive layer 141 in the terminal portion B from corrosion resulting from water and ions entering caused by the poor coverage of the insulation layer 16. Moreover, the first protective layer 151 can also protect the first conductive layer 141 from being damaged by the following processes. Furthermore, the first protective layer 151 and the second protective layer 152 provide protection for the first conductive layer 141 or the second conductive layer 142 against the corrosion resulting from water and ions entering the terminal portion B.

As shown in FIG. 3E, in the active area AA according to this embodiment, the display panel 1 include the dielectric layer GI, a third conductive layer 143, the first protective layer 151, and the insulation layer 16 which are sequentially disposed over the first substrate 11 from the bottom to the top, and the above mentioned insulation layer 192 (not shown in the figure) may also disposed over the insulation layer 16. The material of the third conductive layer 143 may be a monolayer or multilayer structure formed by metal (e.g. aluminium, copper, silver, molybdenum, or titanium) or alloy thereof. The third conductive layer 143 may be formed of the structure which is in the same layer and formed by the same process as the source S or the drain D of the TFT T of the sub-pixel P. In the embodiment, the third conductive layer 143 may be, for example but not limited to, the data line of the sub-pixel P, and the third conductive layer 143 has a second top surface S2 and two opposite lateral sides S3 and S4 connected to the second top surface S2. Moreover, the first protective layer 151 covers the second top surface S2 and the lateral sides S3 and S4 of the third conductive layer 143 to protect the third conductive layer 143 (data line). In other embodiments, the first protective layer 151 may only partially cover the first conductive layer 141, the insulation layer 191 can be disposed over an area of the first conductive layer 141 which is not covered with the first protective layer 151, and the insulation layer 191 is between the first conductive layer 141 and the insulation layer 16.

Hence, in the embodiment, the second top surface S2 and two lateral sides S3 and S4 of the third conductive layer 143 (data line) in the active area AA are covered with the first protective layer 151 to protect the third conductive layer 143 (data line) from damage caused by the following processes (e.g. etching process). Moreover, the first protective layer 151 can also protect the third conductive layer 143 against the corrosion resulting from water and ions entering. In addition, if the third conductive layer 143 is disconnected for any reason, electrical signals can be transmitted by the first protective layer 151. Thus, the risk of failure of the display panel is reduced.

Figure 4:
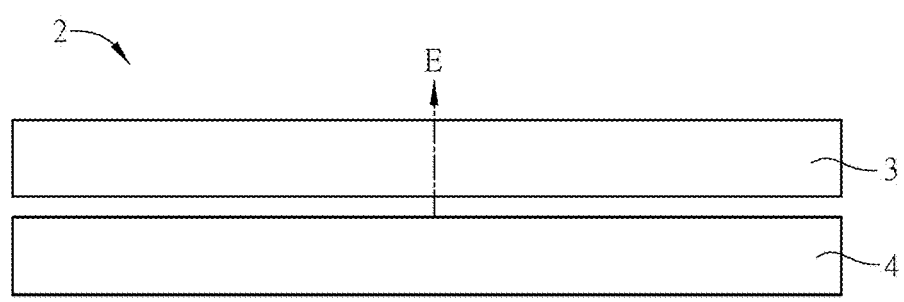
FIG. 4 is a schematic diagram showing a display device according to an embodiment of the disclosure.

Referring to FIG. 4, it is a schematic diagram showing a display device 2 according to an embodiment of the disclosure.

The display device 2 includes a display panel 3 and a backlight module 4. The display panel 3 and the backlight module 4 are disposed opposite each other. The display device 2 is an LCD device, and the display panel 3 may be the above mentioned the display panel 1 or various embodiments thereof. Because related contents can refer to the above description, they are not repeated here. When the light beam L emitted from the backlight module 4 passes through the display panel 3, it displays colors to form an image by each sub-pixel of the display panel 3.

In summary, as to the display panel according to the disclosure, the first conductive layer is disposed over the first substrate and located in the peripheral area, the dielectric layer is disposed between the first substrate and the first conductive layer, the first protective layer covers the first conductive layer, and the insulation layer is disposed over the first protective layer. Accordingly, the first protective layer covers the first conductive layer located in the peripheral area, so that the following processes (e.g. etching process) would damage the first conductive layer less. Moreover, the first protective layer protects the first conductive layer from the corrosion resulting from water and ions entering. Further, if the first conductive layer is disconnected for any reason, electrical signals can be transmitted by the first protective layer. Thus, the risk of failure of the display panel is reduced.

In one embodiment, the first protective layer and the second protective layer protect the first conductive layer from the corrosion resulting from water and ions entering the cross-layer junction in the component/cross-layer region of the peripheral area. In another embodiment, the first top surface and the lateral side of the first conductive layer in the terminal portion of the peripheral area is covered with the first protective layer, which can prevent the corrosion of the first conductive layer resulting from water and ions entering caused by the poor coverage of the insulation layer. Moreover, the first protective layer and the second protective layer may further protect the first conductive layer and the second conductive layer from the corrosion resulting from water and ions entering the terminal portion. In another embodiment, the second top surface and the two lateral sides of the third conductive layer (data lines) are covered with the first protective layer, which can protect the third conductive layer in the active area from damage caused by the following processes (e.g. etching process). Moreover, the first protective layer may also protect the third conductive layer from the corrosion resulting from water and ions entering. Further, if the third conductive layer is disconnected for any reason, electrical signals can be transmitted by the first protective layer. Thus, the risk of failure of the display panel is reduced. Therefore, the display panel according to the disclosure may have better corrosion resistance (anti-corrosion ability) to improve its reliability.

Although the present disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present disclosure.

What is claimed is:

1. A display panel comprising:
   a first substrate comprising an active area and a peripheral area located adjacent to the active area;
   a display layer disposed over the first substrate;
   a first conductive layer disposed over the first substrate and located in the peripheral area;
   a first insulation layer disposed between the first substrate and the first conductive layer;
   a first protective layer covering the first conductive layer, wherein a material of the first protective layer is a transparent conductive oxide; and
   a second insulation layer disposed over the first protective layer.

2. The display panel of claim 1, wherein a first thickness of the first protective layer is between 300 Å and 1000 Å.

3. The display panel of claim 1, wherein the transparent conductive oxide is selected from at least one of indium tin oxide, indium zinc oxide, aluminum zinc oxide, gallium zinc oxide, indium zinc tin oxide, and zinc oxide.

4. The display panel of claim 1, wherein the first conductive layer comprises a first top surface and a first lateral side, and the first protective layer covers the first top surface and the first lateral side.

5. The display panel of claim 1, further comprising:
   a second protective layer disposed over the second insulation layer, wherein the first protective layer is disposed between the first conductive layer and the second protective layer.

6. The display panel of claim 5, wherein a second thickness of the second protective layer is between 300 Å and 1000 Å.

7. The display panel of claim 5, wherein the material of the second protective layer is selected from at least one of indium tin oxide, indium zinc oxide, aluminum zinc oxide, gallium zinc oxide, indium zinc tin oxide, and zinc oxide.

8. The display panel of claim 5, wherein the second insulation layer comprises a first via, and the second protective layer is further formed in the first via and contacts the first protective layer.

9. The display panel of claim 8, further comprising:
   a second conductive layer disposed between the first substrate and the first insulation layer.

10. The display panel of claim 9, wherein the first insulation layer comprises at least a second via, the first conductive layer and the first protective layer are further formed in the second via, and the first conductive layer contacts the second conductive layer.

11. The display panel of claim 5, further comprising:
    a sub-pixel arranged on the first substrate and located in the active area, wherein the sub-pixel includes a first electrode and a second electrode, wherein the second protective layer and either of the first electrode and the second electrode are made from the same material by the same manufacturing process.

12. The display panel of claim 1, further comprising:
    a third conductive layer disposed over the first substrate and located in the active area, wherein the third conductive layer includes a second top surface and two opposite second lateral sides connected to the second top surface, and the first protective layer further covers the second top surface and the second lateral sides.

13. The display panel of claim 1, further comprising:
    an electronic component disposed over the first substrate and located in the peripheral area.

14. The display panel of claim 1, further comprising:
    a sub-pixel arranged on the first substrate and located in the active area, wherein the sub-pixel includes a first electrode and a second electrode, wherein the first protective layer and either of the first electrode and the second electrode are made from the same material by the same manufacturing process.

15. The display panel of claim 1, further comprising:
    a sub-pixel arranged on the first substrate and located in the active area, wherein the sub-pixel includes a first electrode, a second electrode, and a third insulation layer, the second electrode is disposed over the second insulation layer, the third insulation layer covers the second electrode, and the first electrode is disposed over the third insulation layer.

16. The display panel of claim 15, wherein the sub-pixel further comprises a thin film transistor including a channel layer, the second insulation layer covers the thin film transistor, and the material of the channel layer includes an oxide semiconductor material.

17. The display panel of claim 16, wherein the thin film transistor further comprises a gate, a source and a drain, the gate is disposed corresponding to the channel layer, and the source and the drain respectively are coupled to the channel layer.

18. The display panel of claim 17, wherein the sub-pixel further comprises an etching stop layer, and an end of the source and an end of the drain respectively contact the channel layer through a third via of the etching stop layer.

19. The display panel of claim 17, wherein a fourth via passes through the second insulation layer and the third insulation layer, and the first electrode is further disposed in the fourth via and contact the drain.

* * * * *